US008847645B1

(12) United States Patent
Byeon

(10) Patent No.: US 8,847,645 B1
(45) Date of Patent: Sep. 30, 2014

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Sang-Yeon Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/096,991

(22) Filed: Dec. 4, 2013

(30) Foreign Application Priority Data

Jun. 28, 2013 (KR) ......................... 10-2013-0075243

(51) Int. Cl.
*H03L 7/06* (2006.01)
*G11C 7/22* (2006.01)

(52) U.S. Cl.
CPC ..................................... *G11C 7/222* (2013.01)
USPC .......................................... 327/158; 327/149

(58) Field of Classification Search
USPC .................................. 327/147–149, 156–158
See application file for complete search history.

(56) References Cited

U.S. PATENT DOCUMENTS

| 8,299,948 B2* | 10/2012 | Shibasaki et al. | 341/155 |
| 2003/0200518 A1* | 10/2003 | Saeki | 716/6 |
| 2005/0073344 A1* | 4/2005 | Furuya | 327/158 |
| 2011/0221491 A1* | 9/2011 | Shibasaki et al. | 327/156 |
| 2012/0109356 A1* | 5/2012 | Kong et al. | 700/121 |
| 2012/0139593 A1* | 6/2012 | Saito | 327/156 |
| 2013/0120036 A1* | 5/2013 | Zhu et al. | 327/156 |

FOREIGN PATENT DOCUMENTS

KR 1020110059758 6/2011

\* cited by examiner

*Primary Examiner* — Adam Houston
(74) *Attorney, Agent, or Firm* — IP & T Group LLP

(57) ABSTRACT

A semiconductor device includes a sampling unit suitable for sampling a logic value of an input signal based on an edge of an operation clock to output a sampling signal, an edge detection unit suitable for detecting an edge of the input signal based on the sampling signal, and a phase control unit suitable for controlling a phase of the operation clock while periodically changing a value of a clock delay code at each predetermined period and substituting a code value, which is obtained by calculating a value of the clock delay code corresponding to a time point at which an operation of the edge detection unit is completed and a value of a pre-phase code determined based on the sampling signal, for the clock delay code.

22 Claims, 7 Drawing Sheets

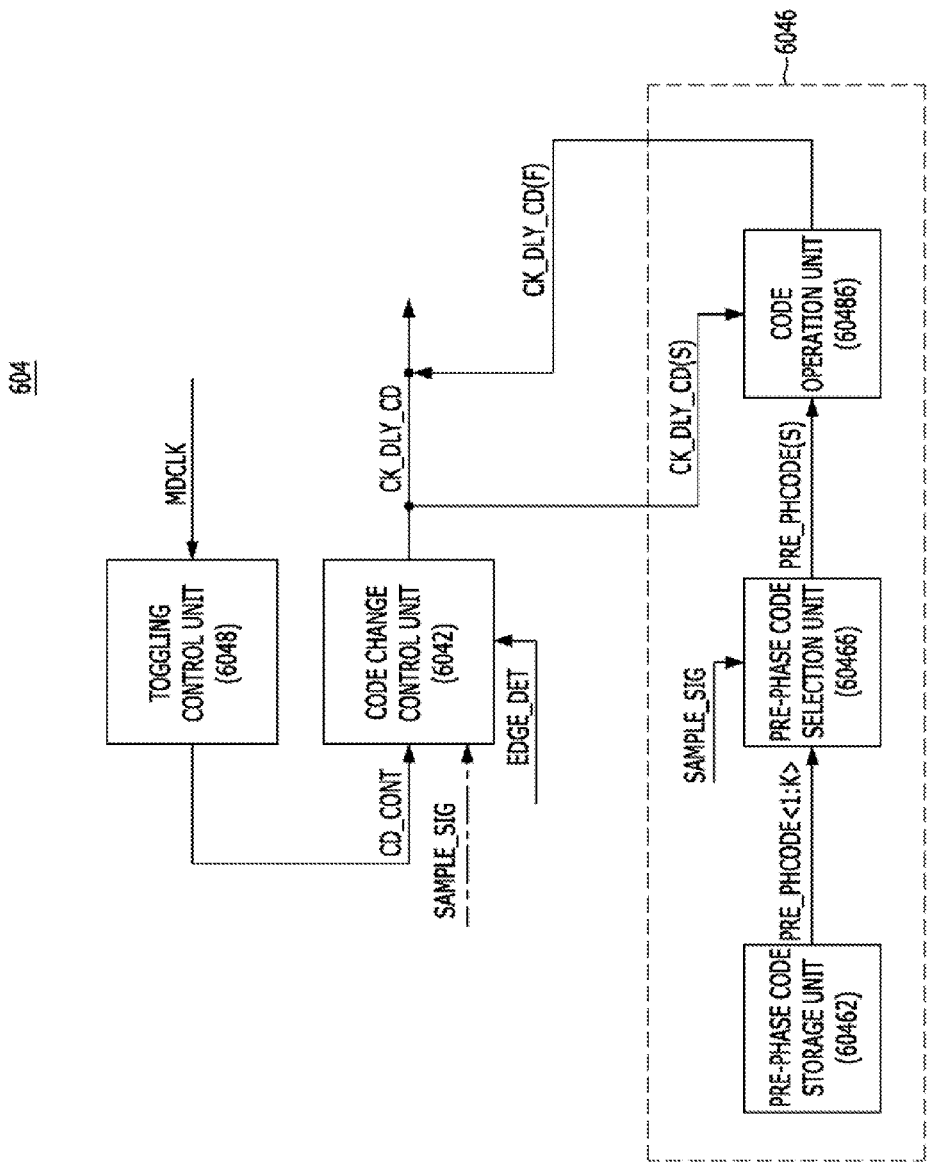

SEMICONDUCTOR DEVICE AND SEMICONDUCTOR SYSTEM INCLUDING THE SAME

CROSS-REFERENCE TO RELATED APPLICATION

The present application claims priority of Korean Patent Application No. 10-2013-0075243, filed on Jun. 28, 2013, which is incorporated herein by reference in its entirety.

BACKGROUND

1. Field

Exemplary embodiments of the present invention relate to semiconductor design technology, and more particularly, to a write training operation of a semiconductor device.

2. Description of the Related Art

In a system including a plurality of semiconductor devices, a semiconductor device corresponding to a transmitter generates and outputs a signal on the basis of a system clock and the signal, and a semiconductor device corresponding to a receiver performs a predetermined operation based on the system dock and the signal. If a semiconductor device corresponding to a transmitter is a memory controller and a semiconductor device corresponding to a receiver is a semiconductor memory device, for example a DDR SDRAM, the system clock serves as an operation clock, the signal as a data signal, and the predetermined operation as an operation of receiving and storing the data signal.

If the transmitter sends the signal to the receiver by using a source synchronization method, the signal and the system dock are transmitted while synchronizing a specific edge of the signal with a specific edge of the system clock. Here, assuming that the channel of the transmitted signal has the same length as the channel of the transmitted system clock, the specific edge of the signal is synchronized with the specific edge of the system clock and both the signal and the system clock are applied to the receiver.

Meanwhile, in order to determine whether a logic value of the signal transmitted from the transmitter to the receiver is '1' or '0', the specific edge of the system clock needs to be placed at the center of the signal, since certain setup and hold time is necessary for recognizing the signal.

That is, the signal is transmitted from the transmitter to the receiver while synchronizing the specific edge of the signal with the specific edge of the system clock. The phase of the system clock applied to the receiver needs to be shifted by 90 degrees because the specific edge of the system clock needs to be placed at the center of the signal at the receiver.

Furthermore, if the length of a channel through which the system clock is transmitted is different from the length of a channel through which the signal is transmitted, it may be necessary to additionally compensate for a difference in the delay amount due to a difference in the length of the channels. That is, when the transmitter synchronizes the specific edge of the signal with the specific edge of the system dock and sends the signal and the system block, the system clock and the signal are out of synchronization at the receiver due to a difference in the transmission delay amount. It may be necessary to compensate for a difference in the transmission delay amount.

Accordingly, a process of the receiver for adjusting a phase relationship between the signal and the system clock, which are applied to the receiver while having specific edges synchronized with each other after the receiver is initially powered up is performed in a specific initial period, so that the specific edge of the system clock is placed at the center of the signal. Such process is called write training operation.

In order to precisely recognize the specific edge of the system clock at the center of the signal in the write training operation, it may be more advantageous for a logic value of the signal, transmitted from the transmitter to the receiver, to have a specific pattern rather than a random pattern in the write training operation. For example, when the signal having a training pattern '1 0 0 0' is transmitted from the transmitter to the receiver, a phase relationship between the signal and the system clock may be easily trained because a case where a first logic value of the signal recognized in the receiver is '1' and the remaining logic values thereof are '0' has only to be searched for. That is, the specific edge of the system clock may be placed at the center of the signal by shifting a phase of the system clock until a logic value of the signal is recognized as being '1 0 0 0' although the signal applied early in the write training operation is not recognized as being a logic value '1 0 0 0'.

However, a time taken to recognize a logic value of the signal as being '1 0 0 0' may differ depending on an initial phase relationship between the signal and the system clock at the receiver. Furthermore, in order to precisely place the specific edge of the system clock at the center of the signal, both rising and falling edges of a pulse corresponding to '1' in the training pattern '1 0 0 0' must be detected.

In this case, the time taken to execute the write training operation may increase.

SUMMARY

An embodiment of the present invention is directed to a semiconductor device that may effectively perform a write training operation for a relatively uniform time although an operation clock has a different transmission condition from an input signal, and a semiconductor system including the same.

In accordance with an embodiment of the present invention, a semiconductor device may include a sampling unit suitable for sampling a logic value of an input signal based on an edge of an operation dock to output a sampling signal, an edge detection unit suitable for detecting an edge of the input signal based on the sampling signal, and a phase control unit suitable for controlling a phase of the operation dock while periodically changing a value of a clock delay code at each predetermined period and substituting a code value, which is obtained by calculating a value of the clock delay code corresponding to a time point at which an operation of the edge detection unit is completed and a value of a pre-phase code determined based on the sampling signal, for the clock delay code.

In accordance with another embodiment of the present invention, a semiconductor system may include a first semiconductor device suitable for synchronizing an edge of an operation clock with an edge of an input signal and outputting the synchronized operation clock and input signal, when performing an initial operation, and controlling a phase of the operation clock based on a clock delay code to output a phase of the input signal without change, after the initial operation, and a second semiconductor device suitable for sampling a logic value of the input signal based on the edge of the operation clock while periodically changing a value of the clock delay code at each predetermined period, detecting an edge of the input signal based on the sampling result, and substituting a code value, which is obtained by calculating a value of the clock delay code corresponding to a time point at which the edge is detected and a value of a pre-phase code previously determined based on the sampling result, for the clock delay code.

In accordance with an embodiment of the present invention, a semiconductor device may include a sampling unit suitable for sampling a logic value of a data signal having a specific training pattern based on an edge of an operation clock, and outputting a sampling signal, an edge detection unit suitable for detecting an edge of the data signal based on the sampling signal, and outputting an edge detection signal, a toggling control unit suitable for toggling the operation control signal whenever a cycle of the operation clock is repeated by a predetermined number, and outputting an operation control signal, a code change control unit suitable changing a value of a clock delay code in response to the edge detection signal and the operation control signal, a phase shift unit suitable for shifting a phase of a system clock by applying a delay amount determined based on the value of the clock delay code to the system clock, and outputting the shifted system clock as the operation clock, and an operation substitution unit suitable for substituting the value, which is obtained by calculating the value of the clock delay code corresponding to the time point at which the operation of the edge detection unit is completed and the value of the pre-phase code, for the clock delay code.

BRIEF DESCRIPTION OF THE DRAWINGS

FIG. 7 is a detailed block diagram of a phase control unit shown in FIG. 6.

DETAILED DESCRIPTION

Figure 1:
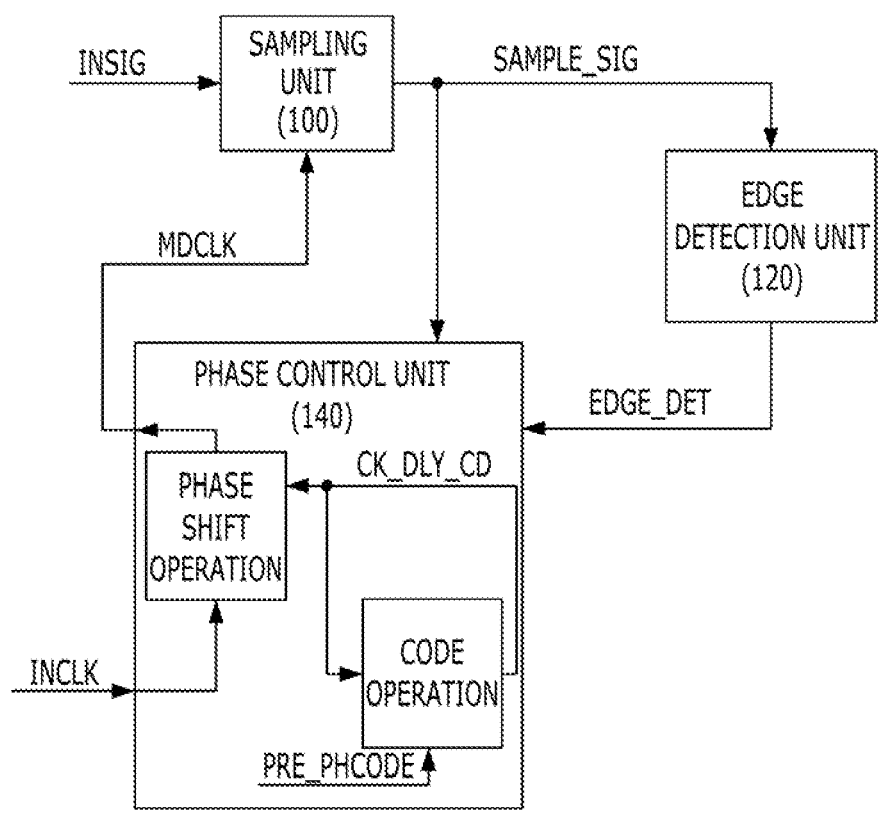
FIG. 1 is a block diagram illustrating a semiconductor device in accordance with an embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor device in accordance with an embodiment of the present invention.

Referring to FIG. 1, the semiconductor device may include a sampling unit 100, an edge detection unit 120, and a phase control unit 140.

The sampling unit 100 samples a logic value of an input signal (e.g., a data signal) INSIG based on an edge of an operation clock MDCLK. That is, the sampling unit 100 determines a logic value of the input signal INSIG in a specific edge of the operation clock MDCLK and generates a sampling signal SAMPLE_SIG based on a result of the determination. For example, if a logic level of the input signal INSIG is logic 'high' in a rising edge of the operation clock MDCLK, a logic level of the sampling signal SAMPLE_SIG is also logic 'high'. Likewise, if a logic level of the input signal INSIG is logic 'low' in a rising edge of the operation clock MDCLK, a logic level of the sampling signal SAMPLE_SIG is logic 'low'. Here, the falling edge of the operation clock MDCLK instead of the rising edge thereof may be used as a criterion for the sampling operation.

The edge detection unit 120 detects an edge of the input signal INSIG to output an edge detection signal EDGE_DET based on the sampling signal SAMPLE_SIG. That is, depending on a shift in the logic value of the sampling signal SAMPLE_SIG outputted from the sampling unit 100, the edge detection unit 120 detects a time point at which an edge of the input signal INSIG is generated. Here, in order for the operation of the edge detection unit 120 to be normally performed, two operations need to be performed at the same time. First, the operation of the sampling unit 100 needs to be repeatedly performed. Furthermore, one of the phase of the operation clock MDCLK and a phase of the input signal INSIG needs to be fixed, but the other of the phases thereof need to be shifting. The two operations for normally executing the operation of the edge detection unit 120 are realized through the operation of the phase control unit 140 to be described later. Accordingly, only the operation of the edge detection unit 120 is described below. For example, a time point at which the sampling signal SAMPLE_SIG of the sampling unit 100 shifts from logic 'low' to logic 'high' after the sampling signal SAMPLE_SIG remains logic 'low' becomes a rising edge of the input signal INSIG. Likewise, a time point at which the sampling signal SAMPLE_SIG of the sampling unit 100 shifts from logic 'high' to logic 'low' after the sampling signal SAMPLE_SIG remains logic 'high' becomes a falling edge of the input signal INSIG.

The phase control unit 140 performs an operation of controlling the phase of the operation clock MDCLK while periodically varying a value of a clock delay code CK_DLY_CD at each predetermined period for the operation of the edge detection unit 120 to be normally performed. That is, the phase control unit 140 controls the phase of the operation clock MDCLK, while fixing a phase of an input clock INCLK, through the operation of periodically varying a value of the clock delay code CK_DLY_CD to determine a difference between a phase of the input clock INCLK and the phase of the operation clock MDCLK. Furthermore, the phase control unit 140 performs an operation of calculating a value of a pre-phase code PRE_PHCODE that is predetermined based on a value of the clock delay code CK_DLY_CD, corresponding to a time point at which the operation of the edge detection unit 120 is completed after being normally performed, and the output signal of the sampling unit 100 and substituting the calculated value for the clock delay code CK_DLY_CD. That is, if a value of the clock delay code CK_DLY_CD continues to vary and the phase of the operation clock. MDCLK is controlled, the operation of the edge detection unit 120 may be normally completed. The phase control unit 140 calculates a value of the clock delay code CK_DLY_CD, corresponding to a time point at which the operation of the edge detection unit 120 is completed as described above, and a value of the pre-phase code PRE_PHCODE and finally determines a value of the clock delay code CK_DLY_CD for defining a difference between the phase of the operation clock MDCLK and a phase of the input signal INSIG. Here, a value of the pre-phase code PRE_PHCODE may be previously determined based on the output signal of the sampling unit 100.

Furthermore, when the input signal INSIG has a training pattern being toggled per predetermined cycle, the operations of the sampling unit 100, the edge detection unit 120, and the phase control unit 140 may be smoothly performed. That is, when a value of the input signal INSIG is not randomly determined, but the input signal in INSIG has a specific training pattern, for example, a form in which '1 0 0 0' or '1 1 0 0' continues to be repeated, the operations of the sampling unit 100, the edge detection unit 120, and the phase control unit 140 may be smoothly performed. For reference, in the following description, it is assumed that a value of the input signal INSIG has a specific training pattern, that is, a form in which '1 0 0 0' continues to be repeated.

Figure 2:
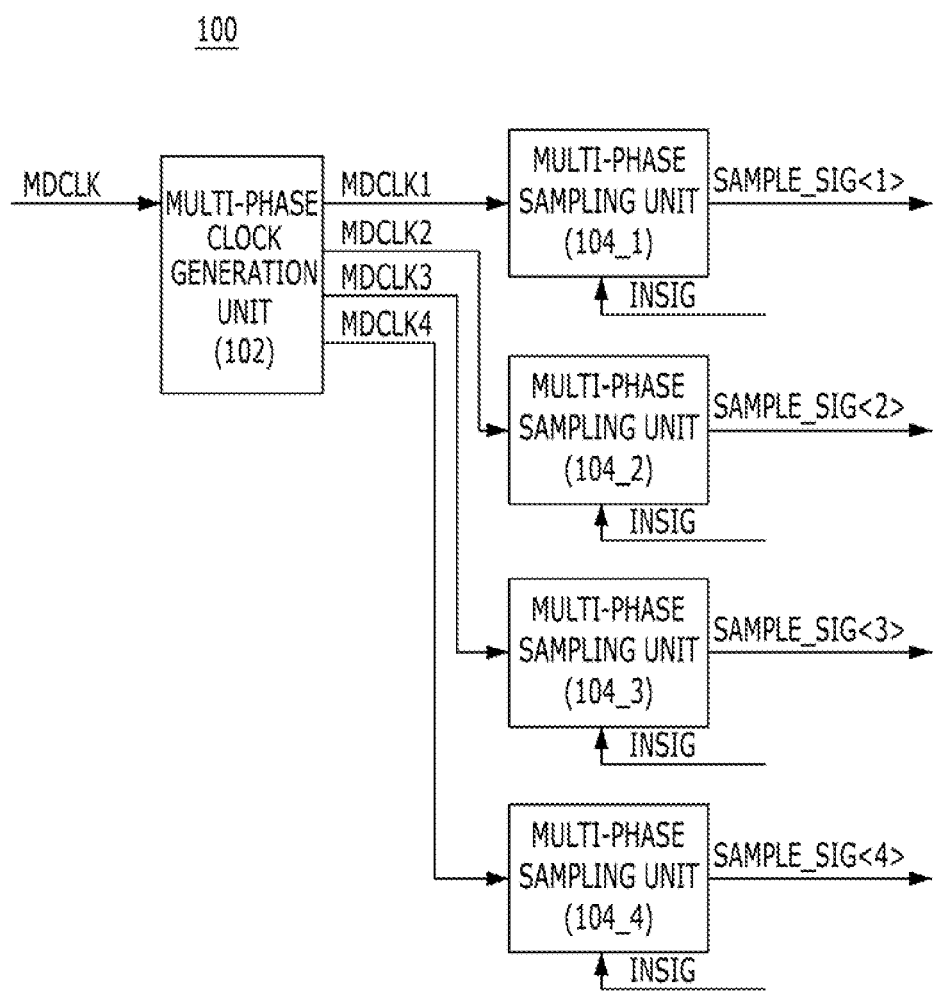
FIG. 2 is a detailed block diagram of a sampling unit shown in FIG. 1.

FIG. 2 is a detailed block diagram of the sampling unit 100 shown in FIG. 1.

Referring to FIG. 2, the sampling unit 100 includes a multi-phase clock generation unit 102 and a plurality of multi-phase sampling units 104_1 to 104_4.

The multi-phase clock generation unit 102 generates a first operation clock MDCLK1 shifted by 0 degree from the phase of the operation clock MDCLK, a second operation clock MDCLK2 shifted by 90 degrees from the phase of the operation dock MDCLK, a third operation clock MDCLK3 shifted by 180 degrees from the phase of the operation clock MDCLK, and a fourth operation clock MDCLK4 shifted by 270 degrees from the phase of the operation dock MDCLK.

The multi-phase sampling units 104_1 to 104_4 generate a first sampling bit SAMPLE_SIG<1> a second sampling bit SAMPLE_SIG<2>, a third sampling bit SAMPLE_SIG<3>, and a fourth sampling bit SAMPLE_SIG<4> by sampling respective logic bits of the input signal INSIG at respective set edges of the first operation clock MDCLK1, the second operation clock MDCLK2, the third operation clock MDCLK3 and the fourth operation clock MDCLK4.

More particularly, the multi-phase clock generation unit 102 and the multi-phase sampling units 104_1 to 104_4 determines a logic value of the input signal INSIG at a specific edge of the first operation clock MDCLK1 the same phase as the operation clock MDCLK and determines the first sampling bit SAMPLE_SIG<1> based on a result of the determination, determines a logic value of the input signal INSIG at a specific edge the second operation clock MDCLK2 shifted by 90 degrees from the phase of the operation clock MDCLK and determines the second sampling bit SAMPLE_SIG<2> based on a result of the determination, determines a logic value of the input signal INSIG at a specific edge of the third operation clock MDCLK3 shifted by 180 degrees from the phase of the operation clock MDCLK and determines the third sampling bit SAMPLE_SIG<3> based on a result of the determination, and determines a logic value of the input signal INSIG at a specific edge of the fourth operation dock MDCLK4 shifted by 270 degrees from the phase of the operation dock MDCLK and determines the fourth sampling bit SAMPLE_SIG<4> based on a result of the determination.

It can be seen that a logic value of the input signal INSIG has what value in each cycle (e.g., 1 tCK) of the operation clock MDCLK because the first to fourth operation clocks MDCLK1, MDCLK2, MDCLK3, and MDCLK4, that is, criteria for a sampling operation, are set to have a phase difference of 90 degrees as described above. For example, if a logic value of the input signal INSIG is logic 'high' at a rising edge of the first operation clock MDCLK1, the first sampling bit SAMPLE_SIG<1> becomes '1'. If a logic value of the input signal INSIG is logic 'low' at a rising edge of the second operation clock MDCLK2, the second sampling bit SAMPLE_SIG<2> becomes '0' If a logic value of the input signal INSIG is logic 'low' at a rising edge of the third operation clock MDCLK3, the third sampling bit SAMPLE_SIG<3> becomes '0'. If a logic value of the input signal INSIG is logic 'low' at a rising edge of the fourth operation dock MDCLK4, the fourth sampling bit SAMPLE_SIG<4> becomes '0'. It may also, be seen that the input signal INSIG has a logic value of '1 0 0 0' in each cycle (e.g., 1 tCK) of the operation clock MDCLK. Furthermore, it can be easily seen that the input signal INSIG has a training pattern '1 0 0 0' if a logic value of the input signal INSIG is sampled as '1 0 0 0' even in a next cycle of the operation clock MDCLK.

The multi-phase clock generation unit 102 may generate the four operation clocks MDCLK1, MDCLK2, MDCLK3, and MDCLK4, each having a phase difference of 90 degrees, by shifting the phase of the operation clock MDCLK four times by 90 degrees for each cycle (e.g., 1 tCK) of the operation clock MDCLK. However, the operation of the multi-phase clock generation unit 102 is only illustrative and may be modified in various ways depending on the designer in such a manner that, for example, the multi-phase clock generation unit 102 generates the four operation clocks MDCLK1, MDCLK2, MDCLK3 and MDCLK4 by shifting the phase of the operation clock MDCLK by 45 degrees eight times or shifting the phase of the operation clock MDCLK by 180 degrees twice.

Likewise, in the multi-phase sampling units 104_1 to 104_4, a logic value of the input signal INSIG corresponding to one cycle (e.g., 1 tCK) of the operation clock MDCLK may be determined at once through the four multi-phase sampling units 104_1 to 104_4 corresponding to the four operation clocks MDCLK1, MDCLK2, MDCLK3, and MDCLK4, respectively. However, the operation of the multi-phase sampling unit 104_1 to 104_4 is only illustrative and may be modified in various ways depending on the designer in such a manner that, for example, a logic value of the input signal INSIG corresponding to one cycle (e.g., 1 tCK) of the operation clock MDCLK is determined at once based on operation clocks MDCLK having a larger or smaller number than the four operation clocks MDCLK1, MDCLK2, MDCLK3, and MDCLK4 depending on the number of the operation clocks MDCLK generated from the multi-phase clock generation unit 102.

Figure 3:
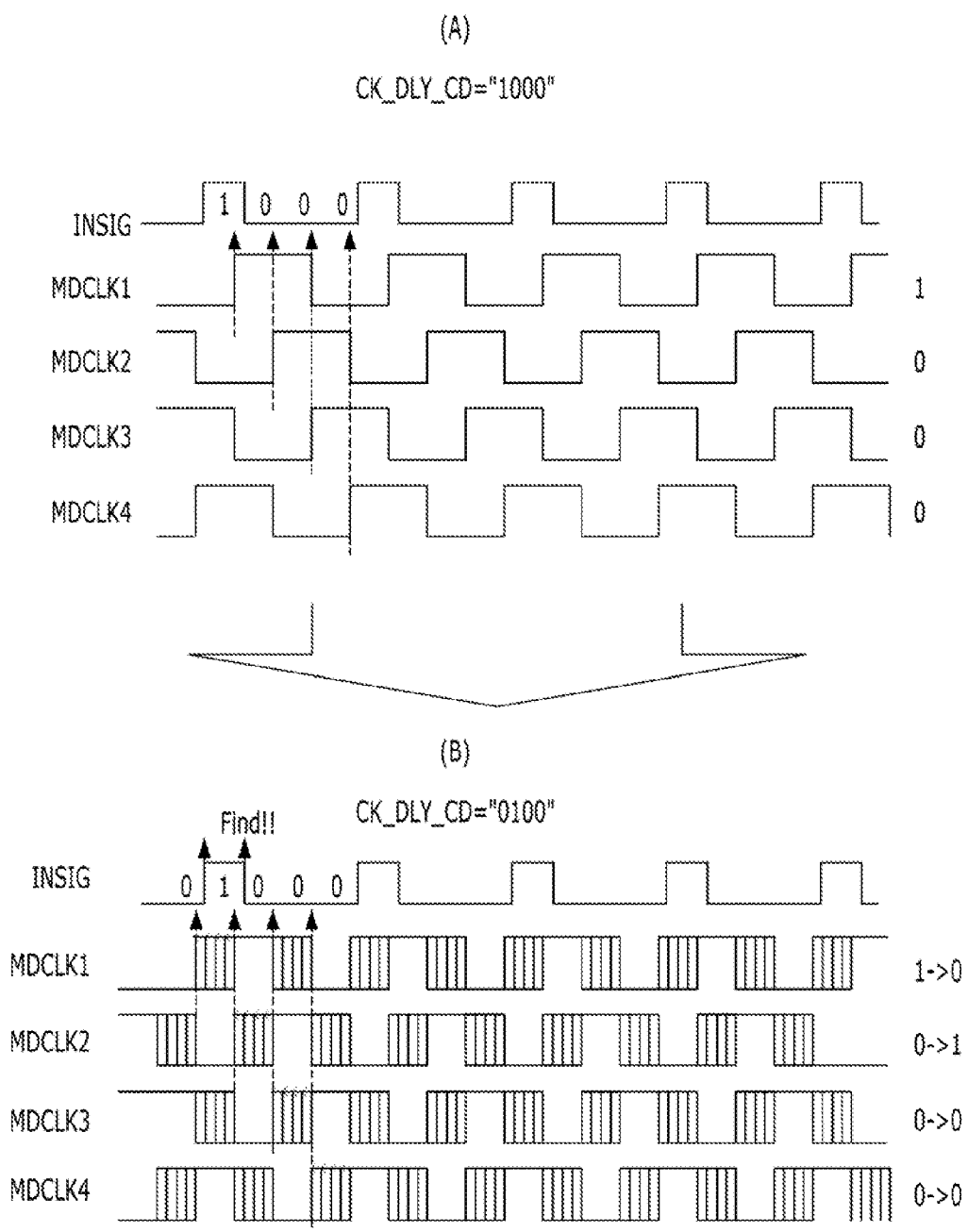
FIG. 3 is a timing diagram for explaining an operation of an edge detection unit shown in FIG. 1.

FIG. 3 is a timing diagram for explaining the operation of the edge detection unit 120 shown in FIG. 1.

FIG. 3 shows an operation of the edge detection unit 120 for detecting edges of the input signal INSIG.

From a view (A), it can be seen that first to fourth sampling bits of the input signal INSIG corresponding to the first to fourth operation clocks MDCLK1, MDCLK2, MDCLK3, and MDCLK4 become '1 0 0 0' according to values of the clock delay code CK_DLY_CD, that is, '1 0 0 0'.

Specifically, the first sampling bit SAMPLE_SIG<1> becomes '1' because a logic value of the input signal INSIG becomes logic 'high' at a rising edge of the first operation clock MDCLK1. Furthermore, the second sampling bit SAMPLE_SIG<2> becomes '0' because a logic value of the input signal INSIG becomes logic 'low' at a rising edge of the second operation clock MDCLK2. Furthermore, the third sampling bit SAMPLE_SIG<3> becomes '0' because a logic value of the input signal INSIG becomes logic 'low' at a rising edge of the third operation clock MDCLK3. Furthermore, the fourth sampling bit SAMPLE_SIG<4> becomes '0' because a logic value of the input signal INSIG becomes logic 'low' at a rising edge of the fourth operation dock MDCLK4.

Furthermore, from a view (B), it can be seen that first to fourth sampling bits of the input signal INSIG corresponding to the first to fourth operation docks MDCLK1, MDCLK2, MDCLK3, and MDCLK4 become '0 1 0 0' according to values of the dock delay code CK_DLY_CD, that is, '0 1 0 0'.

Specifically, the first sampling bit SAMPLE_SIG<1> becomes '0' because a logic value of the input signal INSIG becomes logic 'low' at the rising edge of the first operation clock MDCLK1. Furthermore, the second sampling bit SAMPLE_SIG<2> becomes '1' because a logic value of the input signal INSIG becomes logic 'high' at the rising edge of the second operation clock MDCLK2. Furthermore, the third sampling bit SAMPLE_SIG<3> becomes '0' because a logic value of the input signal INSIG becomes logic 'low' at the rising edge of the third operation clock MDCLK3. Furthermore, the fourth sampling bit. SAMPLE_SIG<4> becomes '0' because a logic value of the input signal INSIG becomes logic 'low' at the rising edge of the fourth operation clock MDCLK4.

When comparing the view (A) with the view (B), it can be seen that the values of the clock delay code CK_DLY_CD, that is, '1 0 0 0' in the view (A) are decreased to '0 1 0 0' in the view (B). Accordingly, it can be seen that phases of the first to fourth operation clocks MDCLK1, MDCLK2, MDCLK3, and MDCLK4 in the view (B) are ahead of those of the first to fourth operation clocks MDCLK1, MDCLK2, MDCLK3, and MDCLK4 in the view (A) based on a phase of the input clock INCLK. Furthermore, it can be seen that a rising edge and falling edge of the input signal INSIG are detected based on a time point at which at least two of the first to fourth sampling bits SAMPLE_SIG<1:4>, corresponding to the first to fourth operation clocks MDCLK1, MDCLK2, MDCLK3, and MDCLK4, are changed at the same time, while the phases of the first to fourth operation clocks MDCLK1, MDCLK2, MDCLK3, and MDCLK4 in the view (A) shift to those of the first to fourth operation clocks MDCLK1, MDCLK2, MDCLK3, and MDCLK4 in the view (B).

That is, the first to fourth operation clocks MDCLK1, MDCLK2, MDCLK3, and MDCLK4 maintain a phase difference of 90 degrees without change, and the phases of the first to fourth operation clocks MDCLK1, MDCLK2, MDCLK3, and MDCLK4 are moved by the exact same delay amount in the process of the view (A) changing into the view (B). Here, a change of the first to fourth sampling bits SAMPLE_SIG<1:4> corresponding to the first to fourth operation clocks MDCLK1, MDCLK2, MDCLK3, and MDCLK4 from '1 0 0 0' to '0 1 0 0' means that a change of the first sampling bit SAMPLE_SIG<1> from '1' to '0' and a change of the second sampling bit SAMPLE_SIG<2> from '0' to '1' are generated at the same time. In this case, it can be seen that a rising edge of the input signal INSIG is detected based on the first operation clock MDCLK1 because the first sampling bit SAMPLE_SIG<1> changes from '1' to '0' and the falling edge of the input signal INSIG is detected based on the second operation clock MDCLK2 because the second sampling bit SAMPLE_SIG<2> changes from '0' to '1'.

Figure 4:
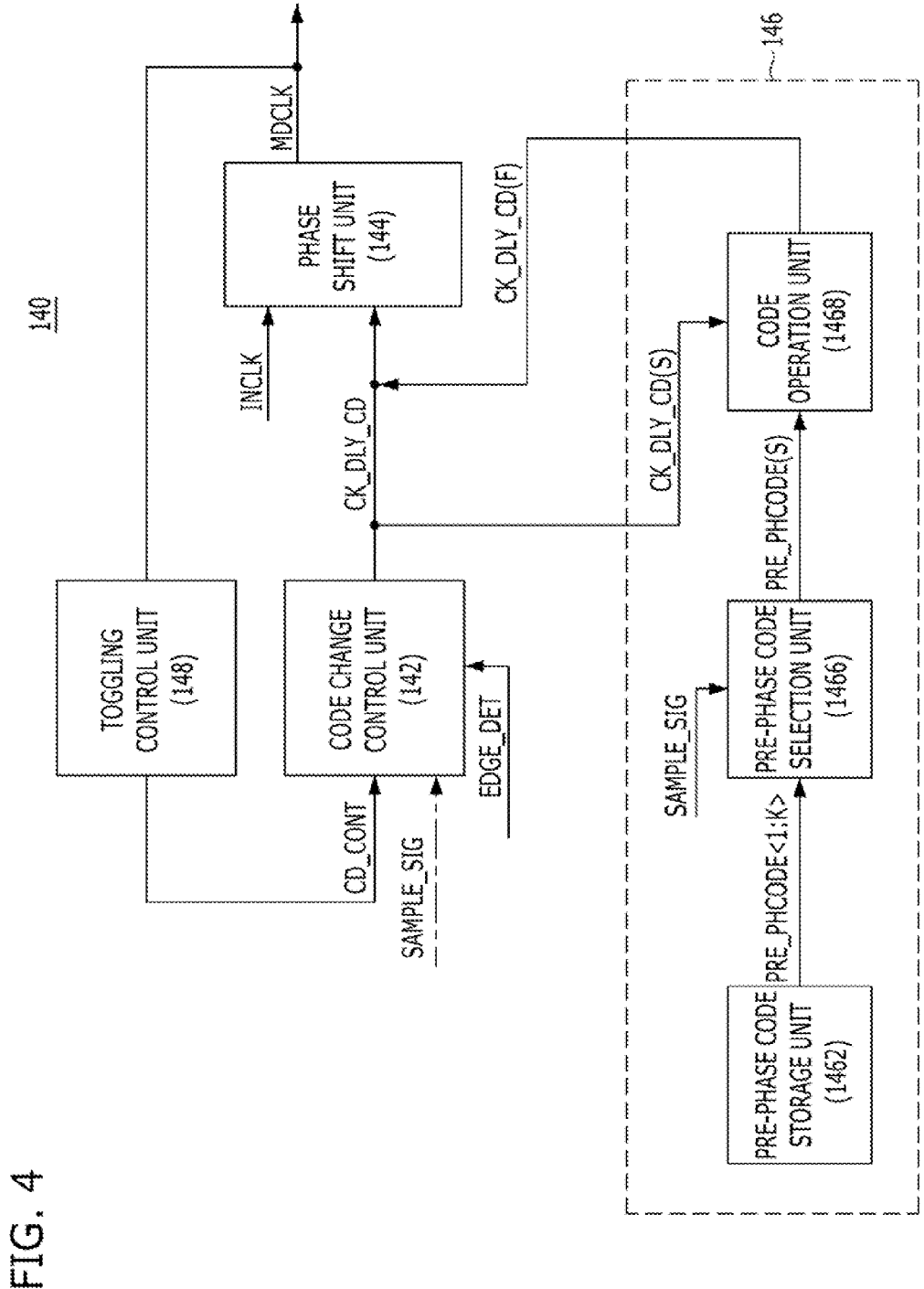
FIG. 4 is a detailed block diagram of a phase control unit shown in FIG. 1.

FIG. 4 is a detailed block diagram of the phase control unit 140 shown in FIG. 1.

Referring to FIG. 4, the phase control unit 140 includes a code change control unit 142, a phase shift unit 144, and an operation substitution unit 146. The phase control unit 140 further includes a toggling control unit 148. Here, the operation substitution unit 146 includes a pre-phase code storage unit 1462, a pre-phase code selection unit 1466, and a code operation unit 1468.

The code change control unit 142 changes a value of the clock delay code CK_DLY_CD in response to an operation control signal CD_CONT that is toggled at each predetermined period. When the code change control unit 142 changes a value of the clock delay code CK_DLY_CD, the sampling signal SAMPLE_SIG of the sampling unit 100 may be used or may not be used.

Specifically, when an initial operation of the semiconductor device is performed the code change control unit 142 sets the clock delay code CK_DLY_CD to an initial value. For example, when the initial operation of the semiconductor device is performed, the clock delay code CK_DLY_CD may be set to an initial value '1 0 0 0'.

If the sampling signal SAMPLE_SIG of the sampling unit 100 is not used after the initial operation of the semiconductor device, the edge detection unit 120 may change a value of the clock delay code CK_DLY_CD at each predetermined period in preset order by a preset change value until an edge of the input signal INSIG is detected, that is, until the operation of the edge detection unit 120 is completed. In other words, the amount of a change of order and value for changing the clock delay code CK_DLY_CD may be previously set in the edge detection unit 120. For example, a value of the clock delay code CK_DLY_CD may be set in such a way as to be unconditionally increased by '1' or decreased by '1' at each predetermined period.

If the sampling signal SAMPLE_SIG of the sampling unit 100 is used after the initial operation of the semiconductor device, the edge detection unit 120 may change a value of the clock delay code CK_DLY_CD based on the output signal of the sampling unit 100 at each predetermined period until at which an edge of the input signal INSIG is detected, that is, until at which the operation of the edge detection unit 120 is completed. That is, the edge detection unit 120 changes a value of the clock delay code CK_DLY_CD at each predetermined period, but may change a value of the clock delay code CK_DLY_CD in such a way as to greatly change a value of the clock delay code CK_DLY_CD at first, check an output signal of the sampling unit 100 based on a result of the change, and then maintain the amount of the change without changing or reducing the amount of the change. For example, the edge detection unit 120 may increase or decrease a value of the clock delay code CK_DLY_CD by '3' at a first predetermined period after the initial operation of the semiconductor device, check an output signal of the sampling unit 100 at a next predetermined period, and increase or decrease a value of the clock delay code CK_DLY_CD by '3' or increase or decrease a value of the clock delay code CK_DLY_CD by '1' based on a result of the check.

For reference, since the sampling signal SAMPLE_SIG of the sampling unit 100 may be used or may not used in the code change control unit 142 as described above, the sampling signal SAMPLE_SIG of the sampling unit 100 applied to the code change control unit 142 is indicated by a dotted line in FIG. 4.

The toggling control unit 148 toggles the operation control signal CD_CONT whenever the cycle of the operation clock MDCLK is repeated by a predetermined number. That is, the toggling control unit 148 toggles the operation control signal CD_CONT in synchronism with the toggling of the operation clock MDCLK so that the operation control signal CD_CONT is synchronized with the operation clock MDCLK at a time point at which the clock delay code CK_DLY_CD is changed. In general, a toggling interval of the operation control signal CD_CONT is wider than a toggling interval of the operation clock MDCLK. That is, a toggling interval of the operation control signal CD_CONT needs to have a minimum time that is necessary for the operations of the code change control unit 142 and the phase shift unit 144 to be completed. Accordingly, the operation control signal CD_CONT is toggled once whenever the operation clock MDCLK is toggled by a predetermined number.

For reference, the toggling control unit 148 may use a counting control method of counting the operation clock MDCLK by a predetermined number and controlling the toggling of the operation control signal CD_CONT based on a result of the counting or may use a clock shifting method of shifting the operation clock MDCLK by a predetermined number and controlling the toggling of the operation control signal CD_CONT when a clock shifting operation is completed. That is, a detailed construction of the toggling control unit 148 may be implemented in various ways by a designer' choice.

The phase shift unit 144 shifts the phase of the operation clock MDCLK by applying the delay amount, varying based on a value of the clock delay code CK_DLY_CD, to the operation clock MDCLK. Specifically, the phase shift unit 144 performs an operation for delaying the input clock INCLK, received from the outside along with the input signal INSIG by the delay amount varying based on a value of the clock delay code CK_DLY_CD and outputting the delayed clock as the operation clock MDCLK. Here, since it may be assumed that a phase of the input clock INCLK is not changed after being received once, the phase of the operation clock MDCLK is changed by the delay amount varying based on a value of the clock delay code CK_DLY_CD.

Figure 5:
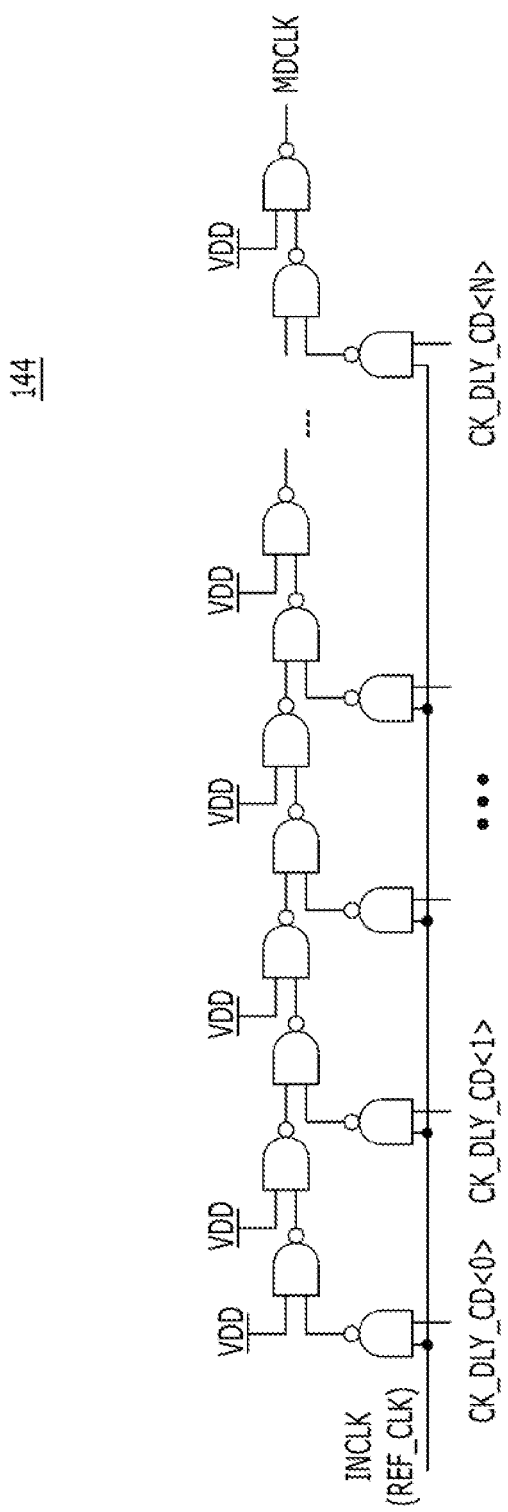
FIG. 5 is a detailed circuit diagram of a phase shift unit shown in FIG. 4.

For a detailed circuit of the phase shift unit 144, reference may be made to FIG. 5. That is, the detailed circuit of FIG. 5 may delay the input clock INCLK by the delay amount varying based on clock delay codes CK_DLY_CD<0:N> and output the delayed clock as the operation clock MDCLK. In particular, the phase shift unit 144 of FIG. 5 adopts a digital circuit method of determining a delay amount variable according to a digital logic operation using a plurality of NAND gates. In some embodiments, an analog circuit method of determining a difference between a phase of the input clock INCLK and the phase of the operation clock MDCLK by controlling an analog delay amount based on the clock delay codes CK_DLY_CD<0:N> may be used in the phase shift unit 144 of FIG. 5.

The operations of the code change control unit 142 and the phase shift unit 144 are described below with reference to FIGS. 3 and 4.

First the clock delay code CK_DLY_CD is a code having 4 bit. It may be assumed that the phase shift unit 144 increases or decreases the phases of the first to fourth operation clocks MDCLK1, MDCLK2, MDCLK3, and MDCLK4 by 11.25 degrees based on a value of the clock delay code CK_DLY_CD that is increased by '1' or decreased by '1'.

Meanwhile, from the view (A), it can be seen that the first to fourth sampling bits SAMPLE_SIG<1:4> become '1 0 0 0' as a result of sampling the logic bits of the input signal INSIG according to phases of the first to fourth operation clocks MDCLK1, MDCLK2, MDCLK3, and MDCLK4.

In this state, since a value of the clock delay code CK_DLY_CD is increased by '1', the phases of the first to fourth operation clocks MDCLK1, MDCLK2, MDCLK3, and MDCLK4 are repeatedly shifted by +11.25 degrees in common. Here, the first to fourth sampling bits of the input signal INSIG corresponding to the first to fourth operation clocks MDCLK1, MDCLK2, MDCLK3, and MDCLK4 maintain '1 0 0 0' until the phases of the first to fourth operation clocks MDCLK1, MDCLK2, MDCLK3, and MDCLK4 are shifted by +33.75 degrees after being repeated and shifted three times. Next, the first to fourth sampling bits of the input signal INSIG corresponding to the first to fourth operation docks MDCLK1, MDCLK2, MDCLK3, and MDCLK4 are changed into '0 1 0 0' until the phases of the first to fourth operation clocks MDCLK1, MDCLK2, MDCLK3, and MDCLK4 are shifted by +45 degrees after being repeated and shifted four times. That is, it can be seen that an edge of the input signal INSIG is placed between 33.75 degrees and 45 degrees from an edge of the input clock INCLK. An edge of the input signal INSIG is detected based on the place.

For reference, in FIG. 3, the phases of the first to fourth operation docks MDCLK1, MDCLK2, MDCLK3, and MDCLK4 are shifted by 11.25 degrees based on a value of the clock delay code CK_DLY_CD that is increased by '1' or decreased by '1' because the clock delay code CK_DLY_CD has 4 bits. It is to be noted that the embodiment may be modified. For example, if the clock delay code CK_DLY_CD has bits larger than or smaller than 4 bits, the amount in which the phases of the first to fourth operation clocks MDCLK1, MDCLK2, MDCLK3, and MDCLK4 are shifted is also changed. For example, assuming that the clock delay code CK_DLY_CD has 6 bits, the phases of the first to fourth operation clocks MDCLK1, MDCLK2, MDCLK3, and MDCLK4 will be increased or decreased by 1.40625 degrees based on a value of the clock delay code CK_DLY_CD that is increased by '1' or decreased by '1'. Here, a designer may determine the number of bits of the clock delay code CK_DLY_CD because a longer operation process may be necessary according to an increase in the number of bits of the clock delay code CK_DLY_CD.

The operation substitution unit 146 substitutes a code value, obtained by calculating a value of the clock delay code CK_DLY_CD corresponding to a time point at which the operation of the edge detection unit 120 is completed after being normally performed and a value of the pre-phase code PRE_PHCODE previously determined based on the sampling signal SAMPLE_SIG of the sampling unit 100, for the clock delay code CK_DLY_CD.

Specifically, from among the elements of the operation substitution unit 146, the pre-phase code storage unit 1462 stores information respecting bits of a plurality of pre-phase codes PRE_PHCODE<1:K> corresponding to a plurality of delay amounts on which the phase shift unit 144 may shift the phase of the operation clock MDCLK at predetermined values. For example, the pre-phase code storage unit 1462 may previously store a value of the clock delay code CK_DLY_CD on which the phase shift unit 144 may shift the phase of the operation clock MDCLK by 45 degrees, by 90 degrees, by 135 degrees by 180 degrees, by 225 degrees, by 270 degrees, and by 315 degrees as bits of the pre-phase codes PRE_PHCODE<1:K>. In other words, assuming that a value of the clock delay code CK_DLY_CD on which the phase shift unit 144 may shift the phase of the operation clock MDCLK by 45 degrees is '0 0 1 0', a value of the clock delay code CK_DLY_CD on which the phase shift unit 144 may shift the phase of the operation clock MDCLK by 90 degrees is '0 1 0 0', a value of the clock delay code CK_DLY_CD on which the phase shift unit 144 may shift the phase of the operation clock MDCLK by 135 degrees is '0 1 1 0', a value of the clock delay code CK_DLY_CD on which the phase shift unit 144 may shift the phase of the operation clock MDCLK by 180 degrees is '1 0 0 0', a value of the clock delay code CK_DLY_CD on which the phase shift unit 144 may shift the phase of the operation clock MDCLK by 225 degrees is '1 0 1 0', a value of the clock delay code CK_DLY_CD on which the phase shift unit 144 may shift the phase of the operation clock MDCLK by 270 degrees is '1 1 0 0' and a value of the clock delay code CK_DLY_CD on which the phase shift unit 144 may shift the phase of the operation clock MDCLK by 315 degrees is '1 1 1 0', all the '0 0 1 0', '0 1 0 0', '0 1 1 0', '1 0 0 0', '1 0 1 0', '1 1 0 0', and '1 1 1 0' will be included in the pre-phase codes PRE_PHCODE<1:K> stored in the pre-phase code storage unit 1462. Here, a designer may more frequently set values on which the phase of the operation clock MDCLK may be controlled.

The pre-phase code selection unit 1466 selects any one (PRE_PHCODE<S>) of the pre-phase codes PRE_PHCODE<1:K>, stored in the pre-phase code storage unit 1462, based on a value of the sampling signal SAMPLE_SIG of the sampling unit 100 at a time point at which the edge detection unit 120 detects an edge of the input signal INSIG.

The code operation unit 1468 substitutes a code value, obtained by adding a value (CK_DLY_CD(S)) of the clock delay code CK_DLY_CD at a time point at which the edge detection unit 120 detects an edge of the input signal INSIG and the value (PRE_PHCODE(S)) of the pre-phase code PRE_PHCODE selected by the pre-phase code selection unit 1466, for value (CK_DLY_CD(F)) of the clock delay code CK_DLY_CD.

More particularly, the value (PRE_PHCODE<S>) of the pre-phase code PRE_PHCODE selected by the pre-phase code selection unit 1466 and the value (CK_DLY_CD(S)) of the clock delay code CK_DLY_CD at a time point at which the edge detection unit 120 detects an edge of the input signal INSIG are applied to the code operation unit 1468 and then outputted as the final clock delay code CK_DLY_CD(F) through mutually set operation. The final clock delay code CK_DLY_CD(F) means a value of the clock delay code CK_DLY_CD on which the final delay amount for the operation clock MDCLK may be selected based on the input clock INCLK so that a value of the sampling signal SAMPLE_SIG of the sampling unit 100 that operates based on the operation clock MDCLK has the same pattern form as a value of the input signal INSIG.

For example, referring to FIGS. 2 and 3, when shifting the phases of the first to fourth operation clocks MDCLK1, MDCLK2, MDCLK3 and MDCLK4 only between 33.75 degrees and 45 degrees based on the input clock INCLK, the edge detection unit 120 detects an edge of the input signal INSIG when the sampling signals SAMPLE_SIG<1:4> of the sampling unit 100 are changed from '1 0 0 0' to '0 1 0 0'. In order to produce '1 0 0 0', that is, the pattern form of the input signal IN_SIG, through the sampling signals SAMPLE_SIG<1:4> of the sampling unit 100 that are changed from to '1 0 0 0' to '0 1 0 0' in response the first to fourth operation clocks MDCLK1, MDCLK2, MDCLK3, and MDCLK4 as described above, a method of less delaying the operation clock MDCLK, having a phase shifted by 45 degrees, by 45 degrees based on the input clock INCLK may be used, or a method of further delaying the operation clock MDCLK having a phase delayed by 45 degrees, by 315 degrees based on the input clock INCLK may be used. Accordingly, a value PRE_PHCODE<S> on which the operation clock MDCLK is delayed by degrees may be selected from the pre-phase codes PRE_PHCODE<1:K> stored in the pre-phase code storage unit 1462, or a value PRE_PHCODE<S> on which the operation clock MDCLK is delayed by +315 degrees may be selected from the pre-phase codes PRE_PHCODE<1:K> stored in the pre-phase code storage unit 1462. The value PRE_PHCODE<S>, together with the clock delay code CK_DLY_CD(S) used to drive the operation clock MDCLK whose phase is delayed by +45 degrees based on the input clock INCLK, is also applied to the code operation unit 1468, thereby becoming the final clock delay code CK_DLY_CD(F) for not delaying the operation clock MDCLK or for delaying the operation clock MDCLK by +360 degrees. As a result, a value of the sampling signal SAMPLE_SIG of the sampling unit 100 that operates based on the operation clock MDCLK has the same pattern form as a value of the input signal INSIG. That is, the write training operation may be terminated.

As a similar example, it may be assumed that the edge detection unit 120 detects an edge of the input signal INSIG when the sampling signals SAMPLE_SIG<1:4> of the sampling unit 100 are changed from '0 1 0 0' to '0 0 1 0' when the phases of the first to fourth operation clocks MDCLK1, MDCLK2, MDCLK3, and MDCLK4 are delayed between 33.75 degrees and 45 degrees based on the input clock INCLK. In order to produce '1 0 0 0', that is, the pattern form of the input signal IN_SIG, through the sampling signals SAMPLE_SIG<1:4> of the sampling unit 100 that are changed from '0 1 0 0' to '0 0 1 0' based on the phases of the first to fourth operation clocks MDCLK1, MDCLK2, MDCLK3, and MDCLK4 as described above, a method of less delaying the operation clock MDCLK, having a phase shifted by 45 degrees, by 135 degrees based on the input clock INCLK may be used, or a method of further delaying the operation clock MDCLK, having a phase delayed by 45 degrees, by 225 degrees based on the input clock INCLK may be used. Accordingly, a value PRE_PHCODE<S> on which the operation clock MDCLK is delayed by −135 degrees may be selected from the pre-phase codes PRE_PHCODE<1:K> stored in the pre-phase code storage unit 1462, or a value PRE_PHCODE<S> on which the operation clock MDCLK is delayed by +225 degrees may be selected from the pre-phase codes PRE_PHCODE<1:K> stored in the pre-phase code storage unit 1462. The value PRE_PHCODE<S>, together with the clock delay code CK_DLY_CD(S) used to drive the operation clock MDCLK whose phase is delayed by +45 degrees based on the input clock INCLK, is also applied to the code operation unit 1468, thereby becoming the final clock delay code CK_DLY_CD(F) for delaying the operation clock MDCLK by −135 degrees or by +225 degrees. As a result, a value of the sampling signal SAMPLE_SIG of the sampling unit 100 that operates based on the operation clock MDCLK has the same pattern form as a value of the input signal INSIG. That is, the write training operation may be terminated.

Figure 6:
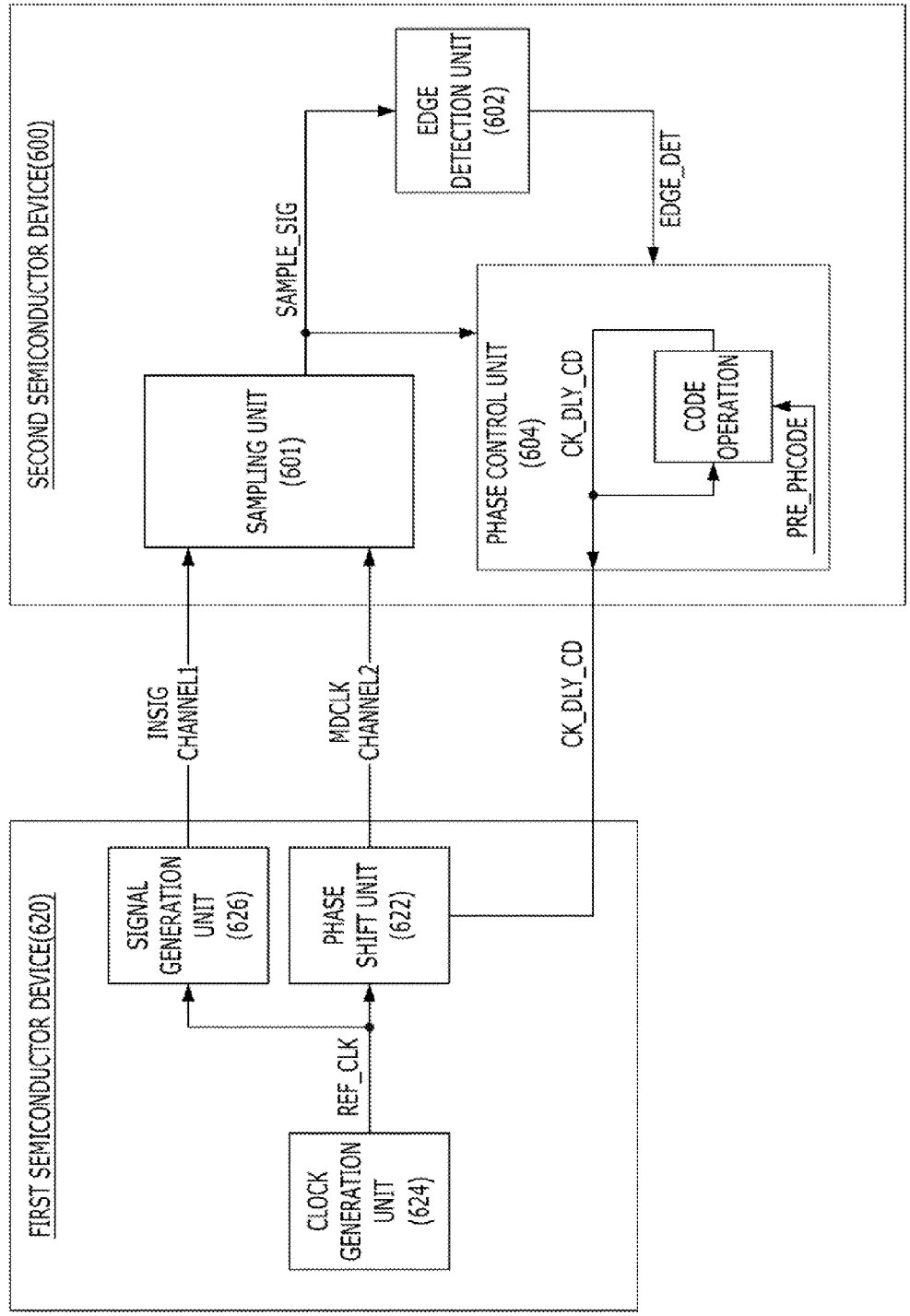
FIG. 6 is a block diagram illustrating a semiconductor system in accordance with an embodiment of the present invention.

FIG. 6 is a block diagram illustrating a semiconductor system in accordance with an embodiment of the present invention.

Referring to FIG. 6, the semiconductor system may include a first semiconductor device 620 and a second semiconductor device 600. The first semiconductor device 620 may include a dock generation unit 624, a signal generation unit 626, and a phase shift unit 622. Furthermore, the second semiconductor device 600 may include a sampling unit 601, an edge detection unit 602 and a phase control unit 604.

When performing an initial operation, the first semiconductor device 620 synchronizes an edge of an operation clock MDCLK and an edge of an input signal INSIG (e.g., a data signal) and outputs the synchronized operation clock MDCLK and input signal INSIG. After the initial operation, the first semiconductor device 620 controls the phase of the operation clock MDCLK based on a clock delay code CK_DLY_CD, but maintains a phase of the input signal INSIG.

The clock generation unit 624, from among the elements of the first semiconductor device 620, generates a source clock REF_CLK.

The signal generation unit 626, from among the elements of the first semiconductor device 620, generates the input signal INSIG having a training pattern based on the source clock REF_CLK. Here, the input signal INSIG has a training pattern being toggled per predetermined cycle. That is, a value of the input signal INSIG is not randomly determined, but a value of the input signal INSIG has a specific training pattern, for example, a form in which '1 0 0 0' or '1 1 0 0' continues to be repeated.

The phase shift unit 622, from among the elements of the first semiconductor device 620, delays a phase of the source clock REF_CLK by the delay amount varying based on the clock delay code CK_DLY_CD and outputs the delayed clock as the operation clock MDCLK. That is, the phase shift unit 622 shifts the phase of the operation clock MDCLK by applying the delay amount, varying based on a value of the clock delay code CK_DLY_CD, to the operation clock MDCLK.

Specifically, the phase shift unit 622 performs an operation for delaying the source clock REF_CLK by the delay amount varying based on a value of the clock delay code CK_DLY_CD and outputting the delayed clock as the operation clock MDCLK. Here, the phase of the operation clock MDCLK is shifted by the delay amount varying based on a value of the clock delay code CK_DLY_CD because it can be seen that the source clock REF_CLK has a fixed phase. Furthermore, the source clock REF_CLK applied to the phase shift unit 622 is applied to the signal generation unit 626 and is used to generate the input signal INSIG. The delay amount of the phase shift unit 622 becomes '0' when performing an initial operation because edges of the operation clock MDCLK and the input signal INSIG should be synchronized when performing the initial operation. That is, when performing an initial operation, the phase shift unit 622 bypasses the source clock REF_CLK and outputs the source clock REF_CLK as the operation clock MDCLK. Accordingly, a phase of the source clock REF_CLK becomes different from that of the operation clock MDCLK from a time point at which the clock delay code CK_DLY_CD is fed back from the second semiconductor device 600.

For a detailed circuit of the phase shift unit 622, reference may be made to FIG. 5. That is, the detailed circuit of FIG. 5 may delay the source clock REF_CLK by the delay amount varying based on clock delay codes CK_DLY_CD<0:N> and output the delayed clock as the operation clock MDCLK. In particular, the phase shift unit 622 of FIG. 6 adopts a digital circuit method of determining a delay amount variable according to a digital logic operation using a plurality of NAND gates. In some embodiments, an analog circuit method of determining a difference between a phase of the input clock INCLK and the phase of the operation clock MDCLK by controlling an analog delay amount based on the clock delay codes CK_DLY_CD<0:N> may be used in the phase shift unit 622 of FIG. 6.

The sampling unit 601, from among the elements of the second semiconductor device 600, samples a logic value of the input signal INSIG based on an edge of the operation clock MDCLK. That is, the sampling unit 601 determines a logic value of the input signal INSIG at a specific edge of the operation clock MDCLK and generates a sampling signal SAMPLE_SIG based on a result of the determination. For example, if a logic level of the input signal INSIG is logic 'high' at a rising edge of the operation clock MDCLK, a logic level of the sampling signal SAMPLE_SIG is also logic 'high'. Likewise, if a logic level of the input signal INSIG is logic 'low' at a rising edge of the operation dock MDCLK, a logic level of the sampling signal SAMPLE_SIG is also logic 'low'. Here, a falling edge of the operation clock MDCLK instead of a rising edge thereof may be used as a criterion for a sampling operation.

For reference, a first channel CHANNEL1 through which the input signal INSIG is transmitted may have a different condition from a second channel CHANNEL2 through which the operation clock MDCLK is transmitted although edges of the input signal INSIG and the operation clock MDCLK that start being transmitted by the first semiconductor device 620 are synchronized. Accordingly, edges of the input signal INSIG and the operation clock MDCLK reached the second semiconductor device 600 may not be synchronized. For this reason, there is a high probability that a logic value of the input signal INSIG sampled by the sampling unit 601 may be recognized as being different from a logic value of the input signal INSIG transmitted by the first semiconductor device 620. For reference, for a detailed construction of the sampling unit 601, reference may be made to FIG. 2, and the construction of FIG. 2 will not be further described herein because it has been described above in detail.

The edge detection unit 602, from among the elements of the second semiconductor device 600, detects an edge of the input signal INSIG based on the sampling signal SAMPLE_SIG of the sampling unit 601 and outputs an edge detection signal EDGE_DET. That is, the edge detection unit 602 detects a time point at which an edge of the input signal INSIG is generated based on a change in the value of the sampling signal SAMPLE_SIG of the sampling unit 601. Here, in order for the operation of the edge detection unit 602 to be normally performed, two operations need to be performed at the same time. First, the operation of the sampling unit 601 needs to be repeatedly performed. Furthermore, one of the phase of the operation clock MDCLK and a phase of the input signal INSIG needs to be fixed, but the other of the phases thereof need to be shifting. The two operations for normally executing the operation of the edge detection unit 602 are realized through the operation of the phase control unit 604 to be described later. Accordingly, only the operation of the edge detection unit 602 is described below. For example, a time point at which the sampling signal SAMPLE_SIG of the sampling unit 601 shifts from logic 'low' to logic 'high' after the sampling signal SAMPLE_SIG remains logic 'low' becomes a rising edge of the input signal INSIG. Likewise, a time point at which the sampling signal SAMPLE_SIG of the sampling unit 601 shifts from logic 'high' to logic 'low' after the sampling signal SAMPLE_SIG remains logic 'high' becomes a falling edge of the input signal INSIG. For reference, for a detailed description of the operation of the edge detection unit 602, reference may be made to FIG. 3. The operation of FIG. 3 will not be further described herein because it has been described in detail above.

The phase control unit 604, from among the elements of the second semiconductor device 600, periodically changes a value of the dock delay code CK_DLY_CD at each predetermined period so that the operation of the edge detection unit 602 is normally performed. The clock delay code CK_DLY_CD having a value changed as described above is fed back to the first semiconductor device 620 and is used for an operation of shifting the phase of the operation clock MDCLK. That is, the first semiconductor device 620 may shift the phase of the operation clock MDCLK while fixing a phase of the source clock REF_CLK, through the operation of periodically changing a value of the clock delay code CK_DLY_CD to determine a difference between a phase of the source clock REF_CLK and the phase of the operation clock MDCLK. Furthermore, the phase control unit 604 performs an operation of calculating a value of a pre-phase code PRE_PHCODE that is predetermined based on a value of the clock delay code CK_DLY_CD, corresponding to a time point at which the operation of the edge detection unit 602 is completed after being normally performed, and the output signal of the sampling unit 601 and substituting the calculated value for the clock delay code CK_DLY_CD. That is, if a value of the clock delay code CK_DLY_CD continues to vary and the phase of the operation clock. MDCLK is controlled, the operation of the edge detection unit 602 may be normally completed. The phase control unit 604 calculates a value of the clock delay code CK_DLY_CD, corresponding to a time point at which the operation of the edge detection unit 602 is completed as described above, and a value of the pre-phase code PRE_PHCODE and finally determines a value of the dock delay code CK_DLY_CD for defining a difference between the phase of the operation clock MDCLK and a phase of the input signal INSIG. Here, a value of the pre-phase code PRE_PHCODE may be previously determined in response to the output signal of the sampling unit 601.

FIG. 7 is a detailed block diagram of the phase control unit 604 shown in FIG. 6.

Referring to FIG. 7, the phase control unit 604 includes a code change control unit 6042 and an operation substitution unit 6046. The phase control unit 604 further includes a toggling control unit 6048. Here, the operation substitution unit 6046 includes a pre-phase code storage unit 60462, a pre-phase code selection unit 60466, and a code operation unit 60468.

The code change control unit 6042 changes a value of the clock delay code CK_DLY_CD in response to an operation control signal CD_CONT that is toggled at each predetermined period. When the code change control unit 6042 changes a value of the clock delay code CK_DLY_CD, the sampling signal SAMPLE_SIG of the sampling unit 601 may be used or may not be used.

Specifically, when an initial operation of the semiconductor device is performed, the code change control unit 6042 sets the clock delay code CK_DLY_CD to an initial value. For example, when the initial operation of the semiconductor device is performed, the clock delay code CK_DLY_CD may be set to an initial value '1 0 0 0'.

If the sampling signal SAMPLE_SIG of the sampling unit 601 is not used after the initial operation of the semiconductor device, the edge detection unit 602 may change a value of the dock delay code CK_DLY_CD at each predetermined period in preset order by a preset change value until an edge of the input signal INSIG is detected, that is, until the operation of the edge detection unit 602 is completed. In other words, the amount of a change of order and value for changing the clock delay code CK_DLY_CD may be previously set in the edge detection unit 602. For example, a value of the clock delay code CK_DLY_CD may be set in such a way as to be unconditionally increased by '1' or decreased by '1' at each predetermined period.

If the sampling signal SAMPLE_SIG of the sampling unit 601 is used after the initial operation of the semiconductor device, the edge detection unit 602 may change a value of the clock delay code CK_DLY_CD in response to the output signal of the sampling unit 601 at each predetermined period until an edge of the input signal INSIG is detected, that is, until the operation of the edge detection unit 602 is completed. That is, the edge detection unit 602 changes a value of the clock delay code CK_DLY_CD at each predetermined period, but may change a value of the dock delay code CK_DLY_CD in such a way as to greatly change a value of the clock delay code CK_DLY_CD at first, check an output signal of the sampling unit 601 based on a result of the change, and then maintain the amount of the change without change or reduce the amount of the change. For example, the edge detection unit 602 may increase or decrease a value of the clock delay code CK_DLY_CD by '3' at a first predetermined period after the initial operation of the semiconductor device, check an output signal of the sampling unit 601 at a next predetermined period, and increase or decrease a value of the clock delay code CK_DLY_CD by '3' or increase or decrease a value of the clock delay code CK_DLY_CD by '1' based on a result of the check.

For reference, since the sampling signal SAMPLE_SIG of the sampling unit 601 may be used or may not be used in the code change control unit 6042 as described above, the sampling signal SAMPLE_SIG of the sampling unit 601 applied to the code change control unit 6042 is indicated by a dotted line in FIG. 7.

The toggling control unit 6048 toggles the operation control signal CD_CONT whenever the cycle of the operation clock MDCLK is repeated by a predetermined number. That is, the toggling control unit 6048 toggles the operation control signal CD_CONT in synchronized with the toggling of the operation clock MDCLK so that the operation control signal CD_CONT is synchronized with the operation clock MDCLK at a time point at which the clock delay code CK_DLY_CD is changed. In general, a toggling interval of the operation control signal CD_CONT is wider than a toggling interval of the operation clock MDCLK. That is, a toggling interval of the operation control signal CD_CONT needs to have a minimum time that is necessary for the operations of the code change control unit 6042 and the phase shift unit 622 to be completed. Accordingly, the operation control signal CD_CONT is toggled once whenever the operation clock MDCLK is toggled by a predetermined number.

For reference, the toggling control unit 6048 may use a counting control method of counting the operation clock MDCLK by a predetermined number and controlling the toggling of the operation control signal CD_CONT based on a result of the counting or may use a clock shifting method of shifting the operation clock MDCLK by a predetermined number and controlling the toggling of the operation control signal CD_CONT when a clock shifting operation is completed. That is, a detailed construction of the toggling control unit 6048 may be implemented in various ways.

The operations of the code change control unit 6042 and the phase shift unit 622 are described below with reference to FIGS. 3, 4, and 7.

First, the clock delay code CK_DLY_CD is a code having 4 bit. It may be assumed that the phase shift unit 622 increases or decreases the phases of the first to fourth operation clocks MDCLK1, MDCLK2, MDCLK3, and MDCLK4 by 11.25 degrees based on a value of the clock delay code CK_DLY_CD that is increased by '1' or decreased by '1'.

Meanwhile, from the view (A), it can be seen that the first to fourth sampling bits SAMPLE_SIG<1:4> become '1 0 0 0' as a result of sampling the logic bits of the input signal INSIG based on phases of the first to fourth operation clocks MDCLK1, MDCLK2, MDCLK3, and MDCLK4.

In this state, since a value of the clock delay code CK_DLY_CD is increased by '1', the phases of the first to fourth operation clocks MDCLK1, MDCLK2, MDCLK3, and MDCLK4 are repeatedly shifted by +11.25 degrees in common. Here, the first to fourth sampling bits of the input signal INSIG corresponding to the first to fourth operation clocks MDCLK1, MDCLK2, MDCLK3, and MDCLK4 maintain '1 0 0 0' until the phases of the first to fourth operation clocks MDCLK1, MDCLK2, MDCLK3, and MDCLK4 are shifted by +33.75 degrees after being repeated and shifted three times. Next, the first to fourth sampling bits of the input signal INSIG corresponding to the first to fourth operation clocks MDCLK1, MDCLK2 MDCLK3, and MDCLK4 are changed into '0 1 0 0' until the phases of the first to fourth operation clocks MDCLK1, MDCLK2, MDCLK3, and MDCLK4 are shifted by +45 degrees after being repeated and shifted four times. That is, it can be seen that an edge of the input signal INSIG is placed between 33.75 degrees and 45 degrees from an edge of the source clock REF_CLK. An edge of the input signal INSIG is detected based on the place.

For reference, in FIG. 3, it has been assumed that the phases of the first to fourth operation clocks MDCLK1, MDCLK2, MDCLK3, and MDCLK4 are shifted by 11.25 degrees based on a value of the clock delay code CK_DLY_CD that is increased by '1' or decreased by '1' because the clock delay code CK_DLY_CD has 4 bits. It is to be noted that the above assumption is only an embodiment. For example, if the clock delay code CK_DLY_CD has bits larger than or smaller than 4 bits, the amount in which the phases of the first to fourth operation clocks MDCLK1, MDCLK2, MDCLK3, and MDCLK4 are shifted is also changed. For example, assuming that the clock delay code CK_DLY_CD has 6 bits, the phases of the first to fourth operation clocks MDCLK1, MDCLK2, MDCLK3, and MDCLK4 will be increased or decreased by 1.40625 degrees based on a value of the clock delay code CK_DLY_CD that is increased by '1' or decreased by '1'. Here, a designer may determine the number of bits of the clock delay code CK_DLY_CD because a longer operation process may be necessary according to an increase in the number of bits of the clock delay code CK_DLY_CD.

The operation substitution unit 5046 substitutes a code value, obtained by calculating a value of the clock delay code CK_DLY_CD corresponding to a time point at which the operation of the edge detection unit 602 is completed after being normally performed and a value of the pre-phase code PRE_PHCODE previously determined based on the sampling signal SAMPLE_SIG of the sampling unit 601, for the clock delay code CK_DLY_CD.

Specifically, from among the elements of the operation substitution unit 6046, the pre-phase code storage unit 60462 stores information regarding bits of a plurality of pre-phase codes PRE_PHCODE<1:K> corresponding to a plurality of delay amounts on which the phase shift unit 622 may shift the phase of the operation clock MDCLK at predetermined values. For example, the pre-phase code storage unit 60462 may previously store a value of the clock delay code CK_DLY_CD on which the phase shift unit 622 may shift the phase of the operation clock MDCLK by 45 degrees, by 90 degrees, by 135 degrees, by 180 degrees, by 225 degrees, by 270 degrees, and by 315 degrees as bits of the pre-phase codes PRE_PHCODE<1:K>. In other words, assuming that a value of the clock delay code CK_DLY_CD on which the phase shift unit 622 may shift the phase of the operation clock MDCLK by 45 degrees is '0 0 1 0', a value of the clock delay code CK_DLY_CD on which the phase shift unit 622 may shift the phase of the operation clock MDCLK by 90 degrees is '0 1 0 0', a value of the clock delay code CK_DLY_CD on which the phase shift unit 622 may shift the phase of the operation clock MDCLK by 135 degrees is '0 1 1 0', a value of the clock delay code CK_DLY_CD on which the phase shift unit 622 may shift the phase of the operation clock MDCLK by 180 degrees is '1 0 0 0', a value of the clock delay code CK_DLY_CD on which the phase shift unit 622 may shift the phase of the operation clock MDCLK by 225 degrees is '1 0 1 0', a value of the clock delay code CK_DLY_CD on which the phase shift unit 622 may shift the phase of the operation clock MDCLK by 270 degrees is '1 1 0 0', and a value of the clock delay code CK_DLY_CD on which the phase shift unit 622 may shift the phase of the operation dock MDCLK by 315 degrees is '1 1 1 0', all the '0 0 1 0', '0 1 0 0', '0 1 1 0', '1 0 0 0', '1 0 1 0', '1 1 0 0', and '1 1 1 0' will be included in the pre-phase codes PRE_PHCODE<1:K> stored in the pre-phase code storage unit 60462. Here, a designer may more frequently set values on which the phase of the operation clock MDCLK may be controlled.

The pre-phase code selection unit 60466 selects any one (PRE_PHCODE<S>) of the pre-phase codes PRE_PHCODE<1:K>, stored in the pre-phase code storage unit 60462 based on a value of the sampling signal SAMPLE_SIG of the sampling unit 601 at a time point at which the edge detection unit 602 detects an edge of the input signal INSIG.

The code operation unit 60468 substitutes a code value, obtained by adding a value (CK_DLY_CD(S)) of the clock delay code CK_DLY_CD at a time point at which the edge detection unit 602 detects an edge of the input signal INSIG and the value (PRE_PHCODE(S)) of the pre-phase code PRE_PHCODE selected by the pre-phase code selection unit 60466, for a value (CK_DLY_CD(F)) of the clock delay code CK_DLY_CD.

More particularly, the value (PRE_PHCODE<S>) of the pre-phase code PRE_PHCODE selected by the pre-phase code selection unit 60466 and the value (CK_DLY_CD(S)) of the clock delay code CK_DLY_CD at a time point at which the edge detection unit 602 detects an edge of the input signal INSIG are applied to the code operation unit 60468 and then outputted as the final dock delay code CK_DLY_CD(F) through mutually set operation. The final clock delay code CK_DLY_CD(F) means a value of the clock delay code CK_DLY_CD on which the final delay amount for the operation clock MDCLK may be selected based on the source clock REF_CLK so that a value of the sampling signal SAMPLE_SIG of the sampling unit 601 that operates based on the operation clock MDCLK has the same pattern form as a value of the input signal INSIG.

For example, referring to FIGS. 2 and 3, when shifting the phases of the first to fourth operation clocks MDCLK1, MDCLK2, MDCLK3, and MDCLK4 only between 33.75 degrees and 45 degrees based on the source clock REF_CLK, the edge detection unit 602 detects an edge of the input signal INSIG when the sampling signals SAMPLE_SIG<1:4> of the sampling unit 601 are changed from '1 0 0 0' to '0 1 0 0'. In order to produce '1 0 0 0', that is, the pattern form of the input signal IN_SIG, through the sampling signals SAMPLE_SIG<1:4> of the sampling unit 601 that are changed from to '1 0 0 0' to '0 1 0 0' in response the first to fourth operation clocks MDCLK1, MDCLK2, MDCLK3, and MDCLK4 as described above, a method of less delaying the operation clock MDCLK, having a phase shifted by 45 degrees, by 45 degrees based on the source clock REF_CLK may be used, or a method of further delaying the operation clock MDCLK, having a phase delayed by 45 degrees, by 315 degrees based on the source clock REF_CLK may be used. Accordingly, a value PRE_PHCODE<S> on which the operation clock MDCLK is delayed by −45 degrees may be selected from the pre-phase codes PRE_PHCODE<1:K> stored in the pre-phase code storage unit 60462, or a value PRE_PHCODE<S> on which the operation clock MDCLK is delayed by +315 degrees may be selected from the pre-phase codes PRE_PHCODE<1:K> stored in the pre-phase code storage unit 60462. The value PRE_PHCODE<S>, together with the clock delay code CK_DLY_CD(S) used to drive the operation clock MDCLK whose phase is delayed by +45 degrees based on the source clock REF_CLK, is also applied to the code operation unit 60468, thereby becoming the final clock delay code CK_DLY_CD(F) for not delaying the operation clock MDCLK or for delaying the operation clock MDCLK by +360 degrees. As a result, a value of the sampling signal SAMPLE_SIG of the sampling unit 601 that operates based on the operation clock MDCLK has the same pattern form as a value of the input signal INSIG. That is, the write training operation may be terminated.

As a similar example, it may be assumed that the edge detection unit 602 detects an edge of the input signal INSIG when the sampling signals SAMPLE_SIG<1:4> of the sampling unit 601 are changed from '0 1 0 0' to '0 0 1 0' when the phases of the first to fourth operation clocks MDCLK1, MDCLK2, MDCLK3, and MDCLK4 are delayed between 33.75 degrees and 45 degrees based on the source clock REF_CLK. In order to produce '1 0 0 0', that is, the pattern form of the input signal IN_SIG, through the sampling signals SAMPLE_SIG<1:4> of the sampling unit 601 that are changed from '0 1 0 0' to '0 0 1 0' based on the phases of the first to fourth operation clocks MDCLK1, MDCLK2, MDCLK3, and MDCLK4 as described above, a method of less delaying the operation dock MDCLK, having a phase shifted by 45 degrees, by 135 degrees based on the source clock REF_CLK may be used, or a method of further delaying the operation clock MDCLK, having a phase delayed by 45 degrees, by 225 degrees based on the source clock REF_CLK may be used. Accordingly, a value PRE_PHCODE<S> on which the operation clock MDCLK is delayed by −135 degrees may be selected from the pre-phase codes PRE_PHCODE<1:K> stored in the pre-phase code storage unit 60462, or a value PRE_PHCODE<S> on which the operation clock MDCLK is delayed by +225 degrees may be selected from the pre-phase codes PRE_PHCODE<1:K> stored in the pre-phase code storage unit 60462. The value PRE_PHCODE<S> together with the clock delay code CK_DLY_CD(S) used to drive the operation clock MDCLK whose phase is delayed by +45 degrees based on the source clock REF_CLK, is also applied to the code operation unit 60468, thereby becoming the final clock delay code CK_DLY_CD(F) for delaying the operation clock MDCLK by 435 degrees or by +225 degrees. As a result, a value of the sampling signal SAMPLE_SIG of the sampling unit 601 that operates based on the operation clock MDCLK has the same pattern form as a value of the input signal INSIG. That is, the write training operation may be terminated.

In the semiconductor system, the first semiconductor device 620 may control a difference between a phase of the source clock REF_CLK and the phase of the operation clock MDCLK. That is, the second semiconductor device 600 merely performs an operation of sending a value of the clock delay code CK_DLY_CD to the first semiconductor device 620.

Meanwhile, as can be seen from FIG. 1, the semiconductor device may directly control a difference between a phase of the input clock INCLK and the phase of the operation clock MDCLK internally. That is, if the semiconductor device shown in FIG. 1 is directly applied to the semiconductor system, the construction for controlling the phase of the operation clock MDCLK may be redundant. Accordingly, it may be necessary to properly deploy the semiconductor device in the semiconductor system so that the construction for controlling the phase of the operation clock MDCLK may not be redundant.

As described above, if the embodiments of the present invention are applied, a logic value of the input signal INSIG sampled based on the operation clock MDCLK is used in a write training operation, bits of the pre-phase codes PRE_PHCODE<1:K>, that is, information necessary to control the phase of the operation clock MDCLK prior to the write training operation, are set, and one of the pre-phase codes PRE_PHCODE<1:K> is selected and used in the write training operation. As a result, the write training operation may be effectively completed during a relatively uniform time although the operation clock MDCLK has a different transmission condition from the input signal INSIG.

Furthermore, a result of sampling between the operation clock and the input signal is used in a write training operation, and information necessary to control the phase of the operation clock previously stored prior to the write training operation is used. Accordingly, the write training operation may be effectively completed during a relatively uniform time although the operation clock has a different transmission condition from the input signal.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a sampling unit suitable for sampling a logic value of an input signal based on an edge of an operation clock to output a sampling signal;
   an edge detection unit suitable for detecting an edge of the input signal based on the sampling signal and
   a phase control unit suitable for controlling a phase of the operation clock while periodically changing a value of a clock delay code at each predetermined period and substituting a code value, which is obtained by calculating a value of the clock delay code corresponding to a time point at which an operation of the edge detection unit is completed and a value of a pre-phase code determined based on the sampling signal, for the clock delay code.

2. The semiconductor device of claim 1, wherein the sampling unit comprises:
   a multi-phase clock generation unit suitable for generating a first operation clock shifted by 0 degree from the phase of the operation clock, a second operation clock shifted by 90 degrees from the phase of the operation clock, a third operation clock shifted by 180 degrees from the phase of the operation clock, and a fourth operation clock shifted by 270 degrees from the phase of the operation clock; and
   a plurality of multi-phase sampling units suitable for generating first to fourth sampling bits of the sampling signal by sampling logic values of the input signal at respective set edges of the first to fourth operation clocks.

3. The semiconductor device of claim 2, wherein the edge detection unit detects the edge of the input signal when at least two of the first to fourth sampling bits of the sampling signal are simultaneously changed.

4. The semiconductor device of claim 1, wherein the phase control unit comprises:
   a code change control unit suitable for changing a value of the clock delay code in response to an operation control signal, which toggles at the each predetermined period;
   a phase shift unit suitable for shifting a phase of the operation clock by applying a delay amount, which varies based on the value of the clock delay code, to the operation clock; and
   an operation substitution unit suitable for substituting the code value, which is obtained by calculating the value of the clock delay code corresponding to the time point at which the operation of the edge detection unit is completed and the value of the pre-phase code, for the clock delay code.

5. The semiconductor device of claim 4, wherein the operation substitution unit comprises:
   a pre-phase code storage unit suitable for storing information respecting values of a plurality of the pre-phase codes corresponding to a plurality of delay amounts;
   a pre-phase code selection unit suitable for selecting any one of the values of the pre-phase codes, stored in the pre-phase code storage unit, based on the sampling signal; and
   a code operation unit suitable for substituting a code value, which is obtained by adding the value of the clock delay code corresponding to the time point at which the operation of the edge detection unit is completed and the value of the pre-phase code selected by the pre-phase code selection unit, for the clock delay code.

6. The semiconductor device of claim 4, wherein the phase control unit further comprises a toggling control unit suitable for toggling the operation control signal whenever a cycle of the operation clock is repeated by a predetermined number.

7. The semiconductor device of claim 4, wherein the code change control unit sets the clock delay code to an initial value when an initial operation is performed and changes a value of the clock delay code by a preset change value in preset order at each predetermined period until the operation of the edge detection unit is completed after the initial operation.

8. The semiconductor device of claim 4, wherein the code change control unit sets the clock delay code to an initial value when an initial operation is performed and changes a value of the clock delay code based on the sampling signal at the each predetermined period until the operation of the edge detection unit is completed after the initial operation.

9. The semiconductor device of claim 1, wherein an edge detection operation of the edge detection unit is completed when any one of a rising edge and a falling edge of the input signal is detected based on the sampling signal.

10. A semiconductor system comprising:
    a first semiconductor device suitable for synchronizing an edge of an operation clock with an edge of an input signal and outputting the synchronized operation clock and input signal, when performing an initial operation, and controlling a phase of the operation clock based on a clock delay code to output a phase of the input signal without change, after the initial operation; and
    a second semiconductor device suitable for sampling a logic value of the input signal based on the edge of the operation clock while periodically changing a value of the clock delay code at each predetermined period, detecting an edge of the input signal based on the sampling result, and substituting a code value, which is obtained by calculating a value of the clock delay code corresponding to a time point at which the edge is detected and a value of a pre-phase code previously determined based on the sampling result, for the clock delay code.

11. The semiconductor system of claim 10, wherein the second semiconductor device comprises:
    a sampling unit suitable for sampling a logic value of the input signal based on the edge of the operation clock to output a sampling signal;
    an edge detection unit suitable for detecting the edge of the input signal based on the sampling signal; and
    a phase control unit suitable for periodically changing a value of the clock delay code at each predetermined period and substituting a code value, which is obtained by calculating a value of the clock delay coder corresponding to a time point at which an operation of the edge detection unit is completed and a value of the pre-phase code determined based on the sampling signal, for the clock delay code.

12. The semiconductor system of claim 11, wherein the sampling unit comprises:
    a multi-phase clock generation unit suitable for generating a first operation clock shifted by 0 degree from the phase of the operation clock, a second operation clock shifted by 90 degrees from the phase of the operation dock, a third operation clock shifted by 150 degrees from the phase of the operation dock, and a fourth operation clock shifted by 270 degrees from the phase of the operation clock; and
    a plurality of multiphase sampling units suitable for generating first to fourth sampling bits of the sampling signal by sampling logic values of the input signal at respective set edges of the first to fourth operation clocks.

13. The semiconductor system of claim 12, wherein the edge detection unit detects the edge of the input signal when at least two of the first to fourth sampling bits of the sampling signal are simultaneously changed.

14. The semiconductor system of claim 11, wherein the phase control unit comprises:
    a code change control unit suitable for changing a value of the clock delay code in response to an operation control signal, which toggles at the each predetermined period; and
    an operation substitution unit suitable for substituting the code value, which is obtained by calculating the value of the clock delay code corresponding to the time point at which the operation of the edge detection unit is completed and the value of the pre-phase code, for the clock delay code.

15. The semiconductor system of claim 14, wherein the operation substitution unit comprises:
    a pre-phase code storage unit suitable for storing information respecting values of a plurality of the pre-phase codes corresponding to a plurality of delay amounts on which a phase shift unit included in the first semiconductor device shifts the phase of the operation clock at respective predetermined values;
    a pre-phase code selection unit suitable for selecting any one of the values of the pre-phase codes, stored in the pre-phase code storage unit, based on the sampling signal; and
    a code operation unit suitable for substituting a code value, which is obtained by adding the value of the clock delay code corresponding to the time point at which the operation of the edge detection unit is completed and the value of the pre-phase code selected by the pre-phase code selection unit, for the clock delay code.

16. The semiconductor system of claim 14, wherein the phase control unit further comprises a toggling control unit suitable for toggling the operation control signal whenever a cycle of the operation clock is repeated by a predetermined number.

17. The semiconductor system of claim 14, wherein the code change control unit sets the dock delay code to an initial value when performing the initial operation and changes a value of the dock delay code by a preset change value in preset order at each predetermined period until the operation of the edge detection unit is completed after the initial operation.

18. The semiconductor system of claim 14, wherein the code change control unit sets the clock delay code to an initial value when performing the initial operation and changes a value of the clock delay code based on the sampling signal at the each predetermined period until the operation of the edge detection unit is completed after the initial operation.

19. The semiconductor system of claim 11, wherein an edge detection operation of the edge detection unit is completed when any one of a rising edge and a falling edge of the input signal is detected based on the sampling signal.

20. The semiconductor system of claim 10, wherein the first semiconductor device comprises:
- a clock generation unit suitable for generating a source clock;
- a signal generation unit suitable for generating the input signal having a training pattern based on the source clock; and
- a phase shift unit suitable for delaying a phase of the source dock by a delay amount varying based on the dock delay code and outputting the delayed clock as the operation clock.

21. A semiconductor device comprising:
- a sampling unit suitable for sampling a logic value of a data signal having a specific training pattern based on an edge of an operation dock, and outputting a sampling signal;
- an edge detection unit suitable for detecting an edge of the data signal based on the sampling signal, and outputting an edge detection signal;
- a toggling control unit suitable for toggling the operation control signal whenever a cycle of the operation clock is repeated by a predetermined number, and outputting an operation control signal;
- a code change control unit suitable changing a value of a clock delay code in response to the edge detection signal and the operation control signal;
- a phase shift unit suitable for shifting a phase of a system clock by applying a delay amount determined based on the value of the clock delay code to the system clock, and outputting the shifted system clock as the operation clock; and
- an operation substitution unit suitable for substituting the value, which is obtained by calculating the value of the clock delay code corresponding to the time point at which the operation of the edge detection unit is completed and the value of the pre-phase code, for the clock delay code.

22. The semiconductor system of claim 21, wherein the operation substitution unit comprises:
- a pre-phase code storage unit suitable for storing information respecting values of a plurality of the pre-phase codes corresponding to a plurality of delay amounts;
- a pre-phase code selection unit suitable for selecting any one of the values of the pre-phase codes, stored in the pre-phase code storage unit, based on the sampling signal; and
- a code operation unit suitable for substituting a code value, which is obtained by adding the value of the clock delay code corresponding to the time point at which the operation of the edge detection unit is completed and the value of the pre-phase code selected by the pre-phase code selection unit, for the clock delay code.

* * * * *